(12) United States Patent
Ma et al.

(10) Patent No.: US 9,780,286 B2
(45) Date of Patent: Oct. 3, 2017

(54) NEBULIZING DRIVING APPARATUS AND NEBULIZING SYSTEM

(71) Applicant: DELTA ELECTRONICS, INC., Taoyuan County (TW)

(72) Inventors: I-Chen Ma, Taoyuan County (TW); Tien-He Chen, Taoyuan County (TW); Yu-Jia Shih, Taoyuan County (TW); Chih-Ching Chang, Taoyuan County (TW); Jung-Yu Lin, Taoyuan County (TW)

(73) Assignee: DELTA ELECTRONICS, INC., Taoyuan (TW)

( * ) Notice: Subject to any disclaimer, the term of this patent is extended or adjusted under 35 U.S.C. 154(b) by 91 days.

(21) Appl. No.: 14/887,798

(22) Filed: Oct. 20, 2015

(65) Prior Publication Data

US 2016/0240767 A1     Aug. 18, 2016

(30) Foreign Application Priority Data

Feb. 16, 2015   (TW) .............................. 104105228 A

(51) Int. Cl.
*H01L 41/04*     (2006.01)
*H01L 41/09*     (2006.01)
(Continued)

(52) U.S. Cl.
CPC ........ *H01L 41/042* (2013.01); *B05B 17/0607* (2013.01); *B05B 17/0669* (2013.01); *H01L 41/09* (2013.01); *B05B 12/081* (2013.01)

(58) Field of Classification Search
CPC ... H01L 41/042; H01L 41/09; B05B 17/0607; B05B 17/0669
(Continued)

(56) References Cited

U.S. PATENT DOCUMENTS 5,757,104 A * 5/1998 Getman ................ B06B 1/0207
                                                  310/317
2004/0250621 A1* 12/2004 Fujimoto ........... G01C 19/5607
                                                  73/504.16
(Continued)

FOREIGN PATENT DOCUMENTS

CN        2905088           5/2007
DE     EP2047914      *   4/2009 ............. B05B 17/06
(Continued)

OTHER PUBLICATIONS

Office Action dated Apr. 8, 2016 from corresponding application No. TW 104105228.
(Continued)

*Primary Examiner* — Chee-Chong Lee
(74) *Attorney, Agent, or Firm* — Hauptman Ham, LLP

(57) ABSTRACT

A nebulizing driving apparatus is used to drive a piezoelectric material of a nebulizing module. The nebulizing driving apparatus includes a driving circuit, a control circuit and a feedback circuit. The feedback circuit detects an electrical data fed back from the piezoelectric material and sends the electrical data to the control circuit when the control circuit is configured to control the driving circuit to drive the piezoelectric material with a driving frequency. According to the electrical data, the control circuit is configured to control the driving circuit to drive the piezoelectric material with a working frequency.

18 Claims, 9 Drawing Sheets

(51) Int. Cl.
*B05B 17/06* (2006.01)
*B05B 12/08* (2006.01)

(58) Field of Classification Search
USPC .................................................. 239/102.2
See application file for complete search history.

(56) References Cited

U.S. PATENT DOCUMENTS

2006/0102172 A1  5/2006  Feiner et al.
2007/0152539 A1*  7/2007  Huang .................. H01L 41/044
                                                              310/318

FOREIGN PATENT DOCUMENTS

EP           0442510        8/1991
TW          200821041       5/2008
WO       WO2012056398       5/2012

OTHER PUBLICATIONS

The extended European search report dated Feb. 11, 2016 from corresponding application No. EP 15190806.8.

* cited by examiner

NEBULIZING DRIVING APPARATUS AND NEBULIZING SYSTEM

BACKGROUND OF THE INVENTION

Field of the Invention

The present invention relates to a driving apparatus and a system, and especially relates to a nebulizing driving apparatus and a nebulizing system.

Description of the Related Art

A nebulizer is a very common electronic apparatus. A related art nebulizer comprises a liquid chamber, a piezoelectric material and a driving circuit. The liquid chamber is connected to the piezoelectric material. The driving circuit is electrically connected to the piezoelectric material. The liquid chamber is used for containing liquid, for example medicinal liquid. The driving circuit is used for driving the piezoelectric material. Liquid in the liquid chamber is nebulized when the driving circuit drives the piezoelectric material. The working frequency of the nebulizer (namely, the frequency which the driving circuit drives the piezoelectric material) is usually between 100 KHz to 150 KHz.

The related art nebulizer comprises following disadvantages:

1. The working frequencies of the most of the nebulizers are set when the nebulizers have been manufactured. In another word, the working frequencies of the nebulizers are fixed. However, the characteristics of each of the piezoelectric materials are different. Therefore, the nebulizing effect cannot be optimized if the working frequencies of all of the nebulizers are fixed. The working frequencies of some of the nebulizers are adjustable by variable resistors. However, this method is not accurate, so that the nebulizing effect of the nebulizer still cannot be optimized.

2. The whole nebulizer has to be abandoned when the piezoelectric material of the nebulizer is damaged.

3. The nebulizer does not automatically detect whether liquid in the liquid chamber is exhausted or not. The nebulizer is damaged easily and energy is wasted when liquid in the liquid chamber is exhausted but the nebulizer is still working.

SUMMARY OF THE INVENTION

In order to solve the above-mentioned problems, an object of the present invention is to provide a nebulizing driving apparatus.

In order to solve the above-mentioned problems, another object of the present invention is to provide a nebulizing system.

In order to achieve the object of the present invention mentioned above, the nebulizing driving apparatus is used to drive a piezoelectric material of a nebulizing module. The nebulizing driving apparatus comprises a driving circuit, a control circuit and a feedback circuit. The driving circuit is electrically connected to the piezoelectric material. The control circuit is electrically connected to the driving circuit. The feedback circuit is electrically connected to the driving circuit, the control circuit and the piezoelectric material. The feedback circuit detects an electrical data fed back from the piezoelectric material and sends the electrical data to the control circuit when the control circuit is configured to control the driving circuit to drive the piezoelectric material with a driving frequency. According to the electrical data, the control circuit is configured to control the driving circuit to drive the piezoelectric material with a working frequency.

Moreover, the nebulizing module further comprises a liquid chamber connected to the piezoelectric material. A liquid in the liquid chamber is nebulized when the driving circuit drives the piezoelectric material.

Moreover, the feedback circuit detects a plurality of the electrical data fed back from the piezoelectric material in accordance with a plurality of different driving frequencies and sends the electrical data to the control circuit when the control circuit is configured to control the driving circuit to drive the piezoelectric material with the different driving frequencies. According to the electrical data, the control circuit is configured to determine the working frequency.

Moreover, the control circuit selects the driving frequency in accordance with a maximum of the electrical data as the working frequency.

Moreover, the control circuit selects a current driving frequency as the working frequency when the electrical data in accordance with the current driving frequency is greater than the electrical data in accordance with a previous driving frequency and is greater than the electrical data in accordance with a next driving frequency. The next driving frequency is greater than the current driving frequency. The current driving frequency is greater than the previous driving frequency.

Moreover, the electrical data in accordance with the working frequency is a maximum of a plurality of current values when the electrical data are the current values.

Moreover, the electrical data in accordance with the working frequency is a maximum of a plurality of voltage values when the electrical data are the voltage values.

Moreover, the control circuit calculates a plurality of current values multiplied by a plurality of voltage values in accordance with the current values respectively to obtain a plurality of power values when the electrical data are the current values and the voltage values in accordance with the current values. The control circuit selects the driving frequency in accordance with a maximum of the power values as the working frequency.

Moreover, after the control circuit controls the driving circuit to drive the piezoelectric material with the working frequency, if the feedback circuit detects that the electrical data fed back from the piezoelectric material is less than or greater than the maximum of the electrical data an offset over a predetermined time, the control circuit controls the driving circuit to stop driving the piezoelectric material. For example, if the maximum of the electrical data is 1 and the offset is 0.1 and the predetermined time is 2 seconds, the piezoelectric material won't be driven if the electrical data fed back from the piezoelectric material is less than 0.9 or greater than 1.1 over 2 seconds.

Moreover, the feedback circuit comprises a voltage detection sub-circuit and a current detection sub-circuit. The voltage detection sub-circuit is electrically connected to the driving circuit, the control circuit and the piezoelectric material. The current detection sub-circuit is electrically connected to the control circuit and the piezoelectric material.

In order to achieve another object of the present invention mentioned above, the nebulizing system comprises a nebulizing driving apparatus and a nebulizing module electrically connected to the nebulizing driving apparatus. The nebulizing module comprises a piezoelectric material electrically connected to the nebulizing driving apparatus. The nebulizing driving apparatus comprises a driving circuit, a control circuit and a feedback circuit. The driving circuit is electrically connected to the piezoelectric material. The control circuit is electrically connected to the driving circuit. The feedback circuit is electrically connected to the driving circuit, the control circuit and the piezoelectric material. The feedback circuit detects an electrical data fed back from the piezoelectric material and sends the electrical data to the control circuit when the control circuit is configured to control the driving circuit to drive the piezoelectric material with a driving frequency. According to the electrical data, the control circuit is configured to control the driving circuit to drive the piezoelectric material with a working frequency.

Moreover, the nebulizing module further comprises a liquid chamber connected to the piezoelectric material. A liquid in the liquid chamber is nebulized when the driving circuit drives the piezoelectric material.

Moreover, the feedback circuit detects a plurality of the electrical data fed back from the piezoelectric material in accordance with a plurality of different driving frequencies and sends the electrical data to the control circuit when the control circuit is configured to control the driving circuit to drive the piezoelectric material with the different driving frequencies. According to the electrical data, the control circuit is configured to determine the working frequency.

Moreover, the control circuit selects the driving frequency in accordance with a maximum of the electrical data as the working frequency.

Moreover, the control circuit selects a current driving frequency as the working frequency when the electrical data in accordance with the current driving frequency is greater than the electrical data in accordance with a previous driving frequency and is greater than the electrical data in accordance with a next driving frequency. The next driving frequency is greater than the current driving frequency. The current driving frequency is greater than the previous driving frequency.

Moreover, the electrical data in accordance with the working frequency is a maximum of a plurality of current values when the electrical data are the current values.

Moreover, the electrical data in accordance with the working frequency is a maximum of a plurality of voltage values when the electrical data are the voltage values.

Moreover, the control circuit calculates a plurality of current values multiplied by a plurality of voltage values in accordance with the current values respectively to obtain a plurality of power values when the electrical data are the current values and the voltage values in accordance with the current values. The control circuit selects the driving frequency in accordance with a maximum of the power values as the working frequency.

Moreover, after the control circuit controls the driving circuit to drive the piezoelectric material with the working frequency, if the feedback circuit detects that the electrical data fed back from the piezoelectric material is less than or greater than the maximum of the electrical data an offset over a predetermined time, the control circuit controls the driving circuit to stop driving the piezoelectric material. For example, if the maximum of the electrical data is 1 and the offset is 0.1 and the predetermined time is 2 seconds, the piezoelectric material won't be driven if the electrical data fed back from the piezoelectric material is less than 0.9 or greater than 1.1 over 2 seconds.

Moreover, the feedback circuit comprises a voltage detection sub-circuit and a current detection sub-circuit. The voltage detection sub-circuit is electrically connected to the driving circuit, the control circuit and the piezoelectric material. The current detection sub-circuit is electrically connected to the control circuit and the piezoelectric material.

The advantages of the present invention comprise:

1. The working frequency of the nebulizer is traced and adjusted automatically, so that the nebulizing effect of the nebulizer is optimized.

2. Only the old nebulizing module is replaced by a new nebulizing module when the piezoelectric material of the nebulizer is damaged. The whole nebulizer does not need to be abandoned. As for the new nebulizing module, the working frequency of the nebulizer is adjusted automatically, so that the nebulizing effect of the nebulizer is optimized.

3. When liquid in the liquid chamber is exhausted, the nebulizer will shut down automatically to save energy and protect the nebulizer.

DETAILED DESCRIPTION OF THE INVENTION

Please refer to following detailed description and figures for the technical content of the present invention. The following detailed description and figures are referred for the present invention, but the present invention is not limited to it.

Figure 1:
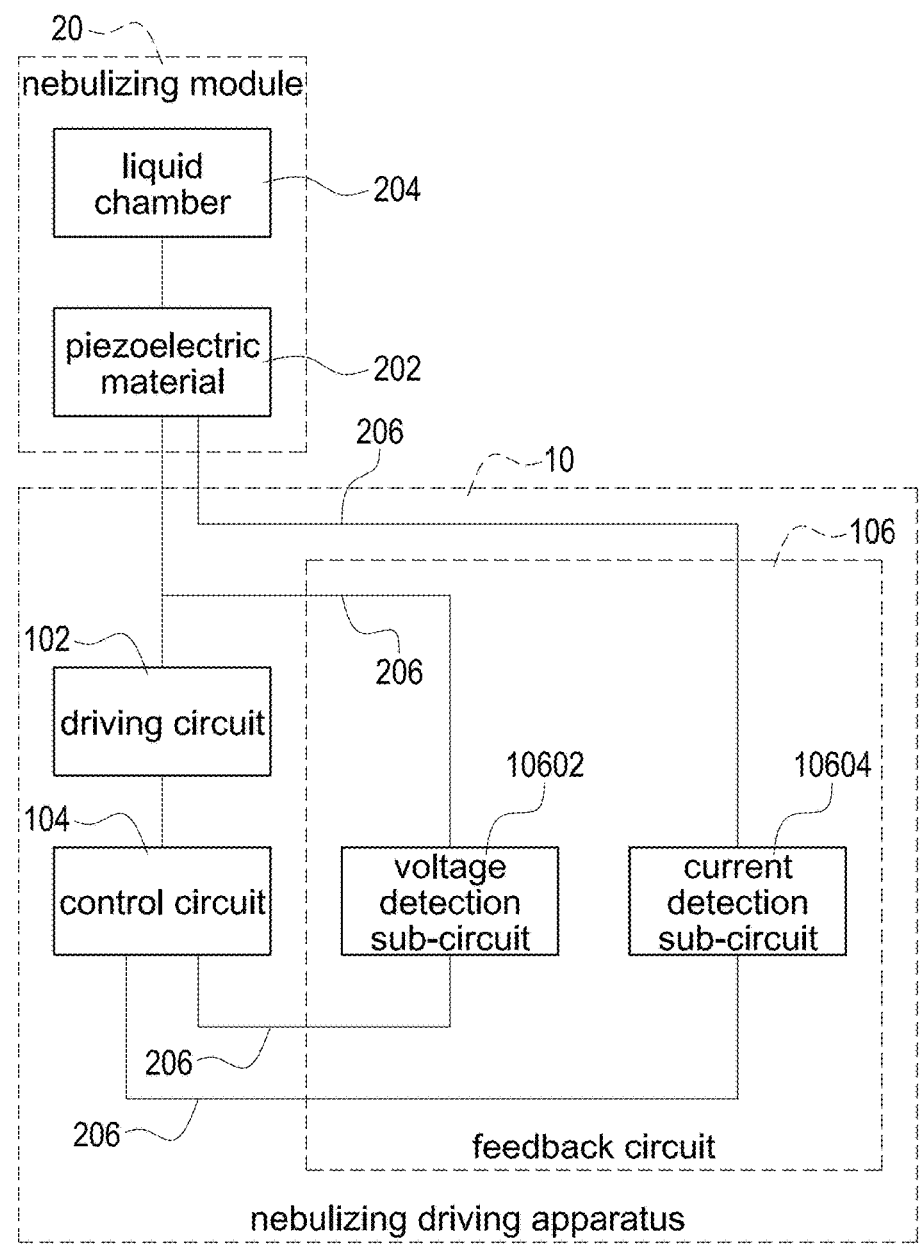
FIG. 1 shows a block diagram of the nebulizing driving apparatus of the present invention.
Figure 2:
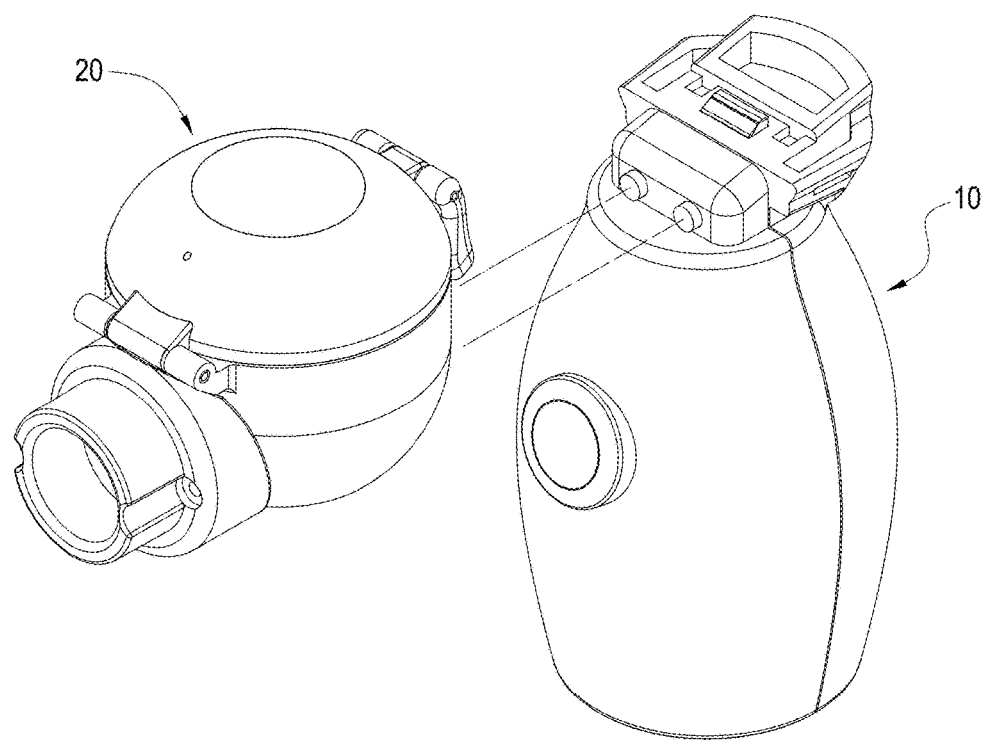
FIG. 2 shows an assembly drawing of the nebulizing driving apparatus of the present invention.

FIG. 1 shows a block diagram of the nebulizing driving apparatus of the present invention. FIG. 2 shows an assembly drawing of the nebulizing driving apparatus of the present invention. A nebulizing driving apparatus 10 is used to drive a piezoelectric material 202 of a nebulizing module 20. The nebulizing module 20 comprises the piezoelectric material 202 and a liquid chamber 204. The nebulizing driving apparatus 10 comprises a driving circuit 102, a control circuit 104 and a feedback circuit 106. The feedback circuit 106 comprises a voltage detection sub-circuit 10602 and a current detection sub-circuit 10604.

The nebulizing module 20 is electrically connected to the nebulizing driving apparatus 10. The piezoelectric material 202 is electrically connected to the nebulizing driving apparatus 10. The driving circuit 102 is electrically connected to the piezoelectric material 202. The control circuit 104 is electrically connected to the driving circuit 102. The feedback circuit 106 is electrically connected to the driving circuit 102, the control circuit 104 and the piezoelectric material 202. The liquid chamber 204 is connected to the piezoelectric material 202. The voltage detection sub-circuit 10602 is electrically connected to the driving circuit 102, the control circuit 104 and the piezoelectric material 202. The current detection sub-circuit 10604 is electrically connected to the control circuit 104 and the piezoelectric material 202.

The main feature of the present invention is that the feedback circuit 106 detects an electrical data 206 fed back from the piezoelectric material 202 and sends the electrical data 206 to the control circuit 104 when the control circuit 104 is configured to control the driving circuit 102 to drive the piezoelectric material 202 with a driving frequency. According to the electrical data 206, the control circuit 104 is configured to control the driving circuit 102 to drive the piezoelectric material 202 with a working frequency. A liquid in the liquid chamber 204 is nebulized when the driving circuit 102 drives the piezoelectric material 202.

Following content introduces how to find out the working frequency. The feedback circuit 106 detects a plurality of the electrical data 206 fed back from the piezoelectric material 202 in accordance with a plurality of different driving frequencies and sends the electrical data 206 to the control circuit 104 when the control circuit 104 is configured to control the driving circuit 102 to drive the piezoelectric material 202 with the different driving frequencies. According to the electrical data 206, the control circuit 104 is configured to determine the working frequency. For example, the control circuit 104 selects the driving frequency in accordance with a maximum of the electrical data 206 as the working frequency.

Figure 3:
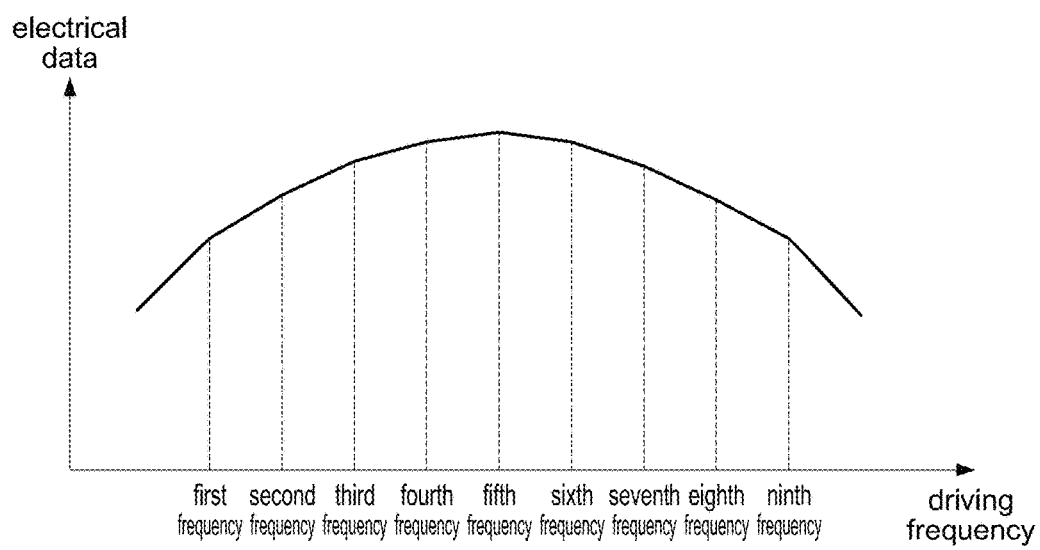
FIG. 3 shows a waveform diagram of an embodiment of the electrical data versus the driving frequencies of the present invention.

FIG. 3 shows a waveform diagram of an embodiment of the electrical data versus the driving frequencies of the present invention. The electrical data 206 can be voltage values, current values or power values. In an embodiment, when the nebulizing driving apparatus 10 is booted up, the control circuit 104 is configured to control the driving circuit 102 to drive the piezoelectric material 202 with a first frequency to a ninth frequency respectively (namely, the first frequency, a second frequency, a third frequency, a fourth frequency, a fifth frequency, a sixth frequency, a seventh frequency, an eighth frequency and the ninth frequency), so that the feedback circuit 106 detects a plurality of the electrical data 206 fed back from the piezoelectric material 202 in accordance with the first frequency to the ninth frequency respectively. The feedback circuit 106 informs the control circuit 104 of the electrical data 206. The control circuit 104 selects the driving frequency in accordance with the maximum of the electrical data 206 as the working frequency. As shown in FIG. 3, the control circuit 104 selects the fifth frequency as the working frequency. After the working frequency is selected, the control circuit 104 is configured to control the driving circuit 102 to drive the piezoelectric material 202 with the working frequency, so that the liquid in the liquid chamber 204 is nebulized.

Figure 11:
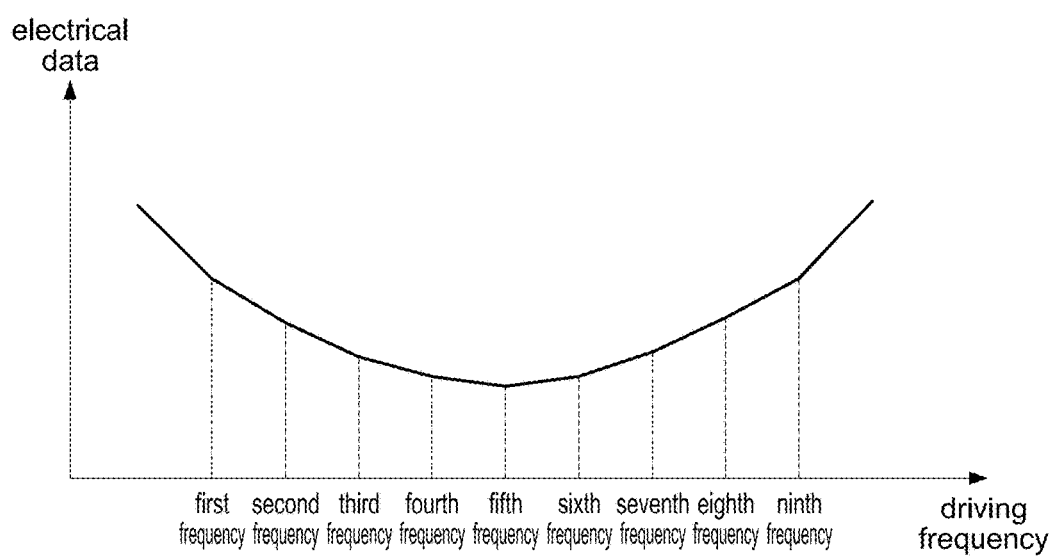
FIG. 11 shows a waveform diagram of another embodiment of the electrical data versus the driving frequencies of the present invention.

FIG. 11 shows a waveform diagram of another embodiment of the electrical data versus the driving frequencies of the present invention. The voltage multiplied by the current equals the power. The voltage and the current have an inverse relationship when the power is fixed. In FIG. 11, the control circuit 104 selects the driving frequency in accordance with a minimum of the electrical data 206 as the working frequency. As shown in FIG. 11, the control circuit 104 selects the fifth frequency as the working frequency. In another word, the present invention is to find out an extreme value (namely, the maximum and the minimum mentioned above). The extreme value is at a slope turning point, such as the fifth frequency shown in FIG. 3 (the slope changes from positive to negative) or FIG. 11 (the slope changes from negative to positive).

In an embodiment, the control circuit 104 selects a current driving frequency (for example, the fifth frequency) as the working frequency when the electrical data 206 in accordance with the current driving frequency (namely, the fifth frequency) is greater than the electrical data 206 in accordance with a previous driving frequency (for example, the fourth frequency) and is greater than the electrical data 206 in accordance with a next driving frequency (for example, the sixth frequency). The next driving frequency (namely, the sixth frequency) is greater than the current driving frequency (namely, the fifth frequency). The current driving frequency (namely, the fifth frequency) is greater than the previous driving frequency (namely, the fourth frequency).

The electrical data 206 in accordance with the working frequency is a maximum of a plurality of current values when the electrical data 206 are the current values. The electrical data 206 in accordance with the working frequency is a maximum of a plurality of voltage values when the electrical data 206 are the voltage values. The control circuit 104 calculates a plurality of current values multiplied by a plurality of voltage values in accordance with the current values respectively to obtain a plurality of power values when the electrical data 206 are the current values and the voltage values in accordance with the current values. The control circuit 104 selects the driving frequency in accordance with a maximum of the power values as the working frequency.

Following content introduces how the present invention automatically detects whether the liquid in the liquid chamber 204 is exhausted or not. After the control circuit 104 controls the driving circuit 102 to drive the piezoelectric material 202 with the working frequency, if the feedback circuit 106 detects that the electrical data 206 fed back from the piezoelectric material 202 is less than or greater than the maximum of the electrical data 206 an offset over a predetermined time, the control circuit 104 controls the driving circuit 102 to stop driving the piezoelectric material 202. For example, if the maximum of the electrical data 206 is 1 and the offset is 0.1 and the predetermined time is 2 seconds, the piezoelectric material 202 won't be driven if the electrical data 206 fed back from the piezoelectric material 202 is less than 0.9 or greater than 1.1 over 2 seconds. The nebulizing driving apparatus 10 even shuts down. This is because after the driving circuit 102 drives the piezoelectric material 202 with the working frequency, the electrical data 206 fed back from the piezoelectric material 202 shall approach the maximum of the electrical data 206. Therefore, once the offset is too large and over the predetermined time, the liquid in the liquid chamber 204 is determined as being exhausted.

Figure 4:
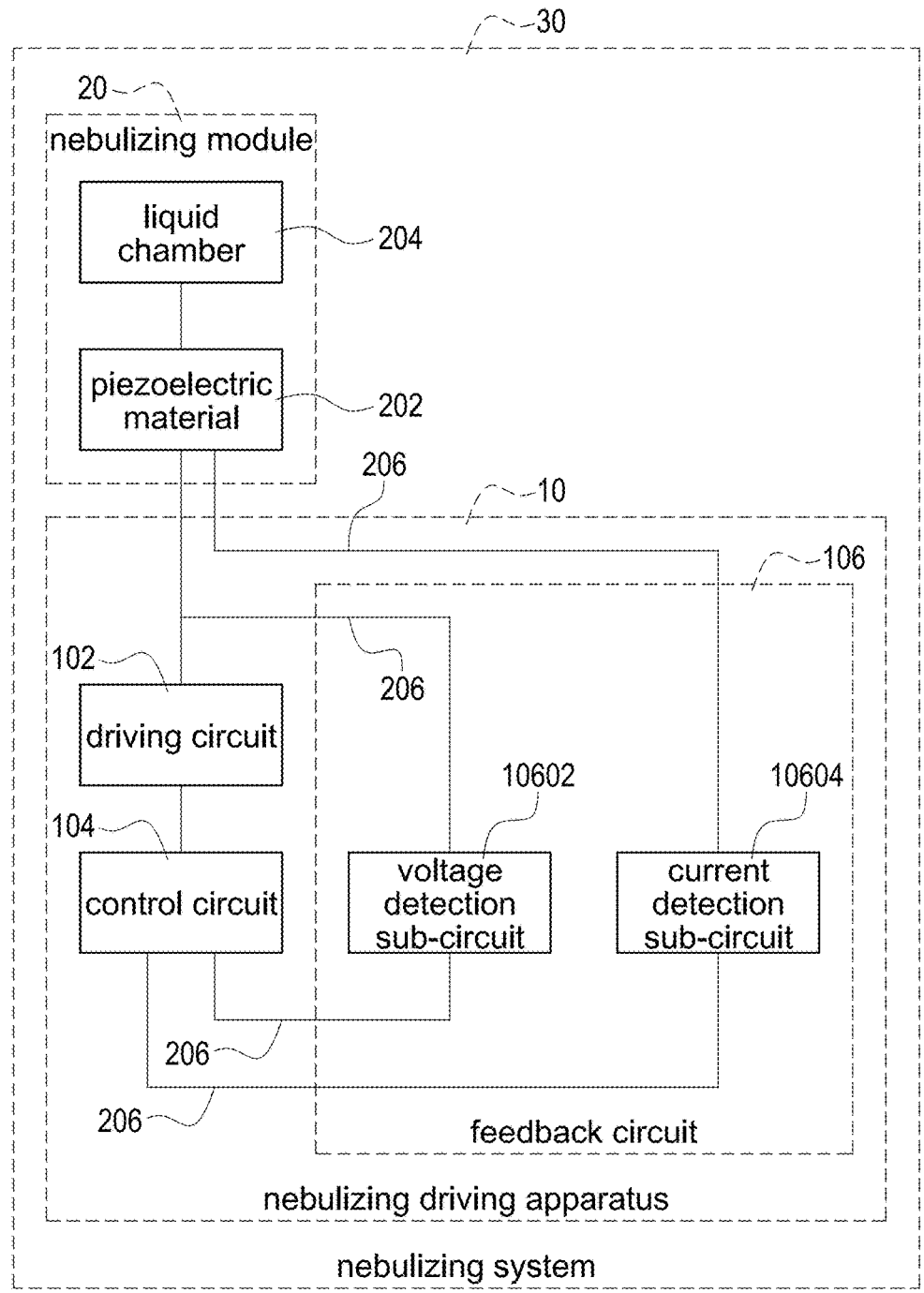
FIG. 4 shows a block diagram of the nebulizing system of the present invention.
Figure 5:
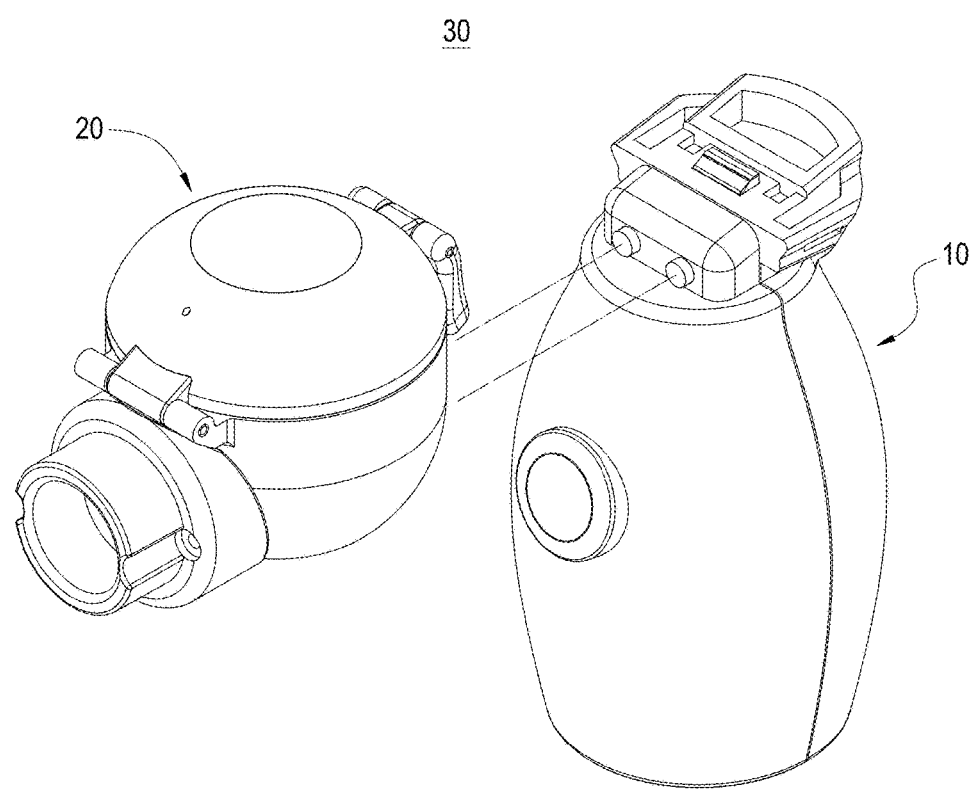
FIG. 5 shows an assembly drawing of the nebulizing system of the present invention.

FIG. 4 shows a block diagram of the nebulizing system of the present invention. FIG. 5 shows an assembly drawing of the nebulizing system of the present invention. A nebulizing system 30 comprises a nebulizing driving apparatus 10 and a nebulizing module 20. The nebulizing module 20 comprises a piezoelectric material 202 and a liquid chamber 204. The nebulizing driving apparatus 10 comprises a driving circuit 102, a control circuit 104 and a feedback circuit 106. The feedback circuit 106 comprises a voltage detection sub-circuit 10602 and a current detection sub-circuit 10604.

The nebulizing module 20 is electrically connected to the nebulizing driving apparatus 10. The piezoelectric material 202 is electrically connected to the nebulizing driving apparatus 10. The driving circuit 102 is electrically connected to the piezoelectric material 202. The control circuit 104 is electrically connected to the driving circuit 102. The feedback circuit 106 is electrically connected to the driving circuit 102, the control circuit 104 and the piezoelectric material 202. The liquid chamber 204 is connected to the piezoelectric material 202. The voltage detection sub-circuit 10602 is electrically connected to the driving circuit 102, the control circuit 104 and the piezoelectric material 202. The current detection sub-circuit 10604 is electrically connected to the control circuit 104 and the piezoelectric material 202.

The main feature of the present invention is that the feedback circuit 106 detects an electrical data 206 fed back from the piezoelectric material 202 and sends the electrical data 206 to the control circuit 104 when the control circuit 104 is configured to control the driving circuit 102 to drive the piezoelectric material 202 with a driving frequency. According to the electrical data 206, the control circuit 104 is configured to control the driving circuit 102 to drive the piezoelectric material 202 with a working frequency. A liquid in the liquid chamber 204 is nebulized when the driving circuit 102 drives the piezoelectric material 202.

Following content introduces how to find out the working frequency. The feedback circuit 106 detects a plurality of the electrical data 206 fed back from the piezoelectric material 202 in accordance with a plurality of different driving frequencies and sends the electrical data 206 to the control circuit 104 when the control circuit 104 is configured to control the driving circuit 102 to drive the piezoelectric material 202 with the different driving frequencies. According to the electrical data 206, the control circuit 104 is configured to determine the working frequency. For example, the control circuit 104 selects the driving frequency in accordance with a maximum of the electrical data 206 as the working frequency.

FIG. 3 shows a waveform diagram of an embodiment of the electrical data versus the driving frequencies of the present invention. The electrical data 206 can be voltage values, current values or power values. In an embodiment, when the nebulizing driving apparatus 10 is booted up, the control circuit 104 is configured to control the driving circuit 102 to drive the piezoelectric material 202 with a first frequency to a ninth frequency respectively (namely, the first frequency, a second frequency, a third frequency, a fourth frequency, a fifth frequency, a sixth frequency, a seventh frequency, an eighth frequency and the ninth frequency), so that the feedback circuit 106 detects a plurality of the electrical data 206 fed back from the piezoelectric material 202 in accordance with the first frequency to the ninth frequency respectively. The feedback circuit 106 informs the control circuit 104 of the electrical data 206. The control circuit 104 selects the driving frequency in accordance with the maximum of the electrical data 206 as the working frequency. As shown in FIG. 3, the control circuit 104 selects the fifth frequency as the working frequency. After the working frequency is selected, the control circuit 104 is configured to control the driving circuit 102 to drive the piezoelectric material 202 with the working frequency, so that the liquid in the liquid chamber 204 is nebulized.

FIG. 11 shows a waveform diagram of another embodiment of the electrical data versus the driving frequencies of the present invention. The voltage multiplied by the current equals the power. The voltage and the current have an inverse relationship when the power is fixed. In FIG. 11, the control circuit 104 selects the driving frequency in accordance with a minimum of the electrical data 206 as the working frequency. As shown in FIG. 11, the control circuit 104 selects the fifth frequency as the working frequency. In another word, the present invention is to find out an extreme value (namely, the maximum and the minimum mentioned above). The extreme value is at a slope turning point, such as the fifth frequency shown in FIG. 3 (the slope changes from positive to negative) or FIG. 11 (the slope changes from negative to positive).

In an embodiment, the control circuit 104 selects a current driving frequency (for example, the fifth frequency) as the working frequency when the electrical data 206 in accordance with the current driving frequency (namely, the fifth frequency) is greater than the electrical data 206 in accordance with a previous driving frequency (for example, the fourth frequency) and is greater than the electrical data 206 in accordance with a next driving frequency (for example, the sixth frequency). The next driving frequency (namely, the sixth frequency) is greater than the current driving frequency (namely, the fifth frequency). The current driving frequency (namely, the fifth frequency) is greater than the previous driving frequency (namely, the fourth frequency).

The electrical data 206 in accordance with the working frequency is a maximum of a plurality of current values when the electrical data 206 are the current values. The electrical data 206 in accordance with the working frequency is a maximum of a plurality of voltage values when the electrical data 206 are the voltage values. The control circuit 104 calculates a plurality of current values multiplied by a plurality of voltage values in accordance with the current values respectively to obtain a plurality of power values when the electrical data 206 are the current values and the voltage values in accordance with the current values. The control circuit 104 selects the driving frequency in accordance with a maximum of the power values as the working frequency.

Following content introduces how the present invention automatically detects whether the liquid in the liquid chamber 204 is exhausted or not. After the control circuit 104 controls the driving circuit 102 to drive the piezoelectric material 202 with the working frequency, if the feedback circuit 106 detects that the electrical data 206 fed back from the piezoelectric material 202 is less than or greater than the maximum of the electrical data 206 an offset over a predetermined time, the control circuit 104 controls the driving circuit 102 to stop driving the piezoelectric material 202. For example, if the maximum of the electrical data 206 is 1 and the offset is 0.1 and the predetermined time is 2 seconds, the piezoelectric material 202 won't be driven if the electrical data 206 fed back from the piezoelectric material 202 is less than 0.9 or greater than 1.1 over 2 seconds. The nebulizing driving apparatus 10 even shuts down. This is because after the driving circuit 102 drives the piezoelectric material 202 with the working frequency, the electrical data 206 fed back from the piezoelectric material 202 shall approach the maximum of the electrical data 206. Therefore, once the offset is too large and over the predetermined time, the liquid in the liquid chamber 204 is determined as being exhausted.

Figure 6:
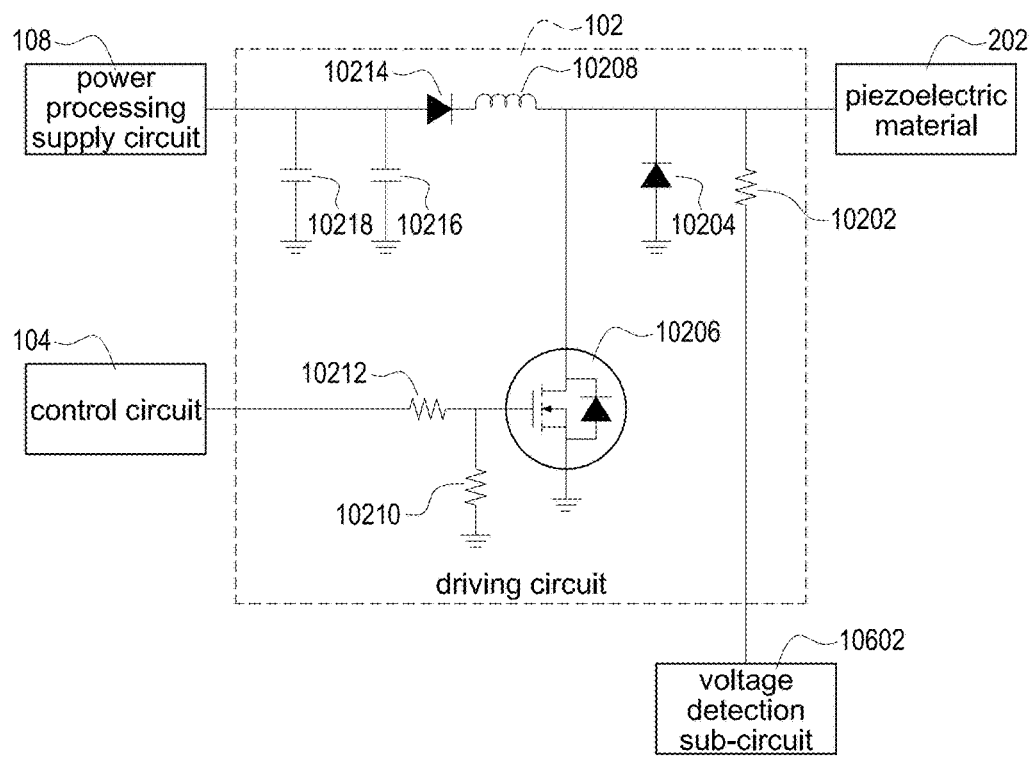
FIG. 6 shows a circuit diagram of the driving circuit of the present invention.

FIG. 6 shows a circuit diagram of the driving circuit of the present invention. The nebulizing driving apparatus 10 further comprises a power processing supply circuit 108. The driving circuit 102 comprises a first resistor 10202, a first diode 10204, a first transistor 10206, a first inductor 10208, a second resistor 10210, a third resistor 10212, a second diode 10214, a first capacitor 10216 and a second capacitor 10218.

The first resistor 10202 is electrically connected to the piezoelectric material 202 and the voltage detection sub-circuit 10602. The first diode 10204 is electrically connected to the piezoelectric material 202 and the first resistor 10202. The first transistor 10206 is electrically connected to the piezoelectric material 202, the first resistor 10202 and the first diode 10204. The first inductor 10208 is electrically connected to the piezoelectric material 202, the first resistor 10202, the first diode 10204 and the first transistor 10206. The second resistor 10210 is electrically connected to the first transistor 10206. The third resistor 10212 is electrically connected to the first transistor 10206, the second resistor 10210 and the control circuit 104. The second diode 10214 is electrically connected to the first inductor 10208 and the power processing supply circuit 108. The first capacitor 10216 is electrically connected to the second diode 10214 and the power processing supply circuit 108. The second capacitor 10218 is electrically connected to the second diode 10214, the power processing supply circuit 108 and the first capacitor 10216.

Figure 7:
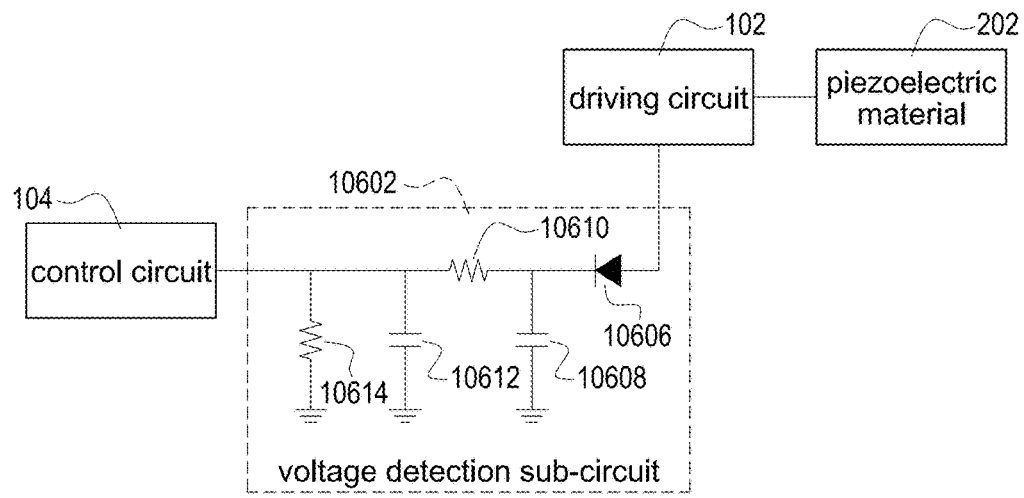
FIG. 7 shows a circuit diagram of the voltage detection sub-circuit of the present invention.

FIG. 7 shows a circuit diagram of the voltage detection sub-circuit of the present invention. The voltage detection sub-circuit 10602 comprises a third diode 10606, a third capacitor 10608, a fourth resistor 10610, a fourth capacitor 10612 and a fifth resistor 10614.

The third diode 10606 is electrically connected to the driving circuit 102. The third capacitor 10608 is electrically connected to the third diode 10606. The fourth resistor 10610 is electrically connected to the third diode 10606, the third capacitor 10608 and the control circuit 104. The fourth capacitor 10612 is electrically connected to the fourth resistor 10610 and the control circuit 104. The fifth resistor 10614 is electrically connected to the fourth resistor 10610, the control circuit 104 and the fourth capacitor 10612.

Figure 8:
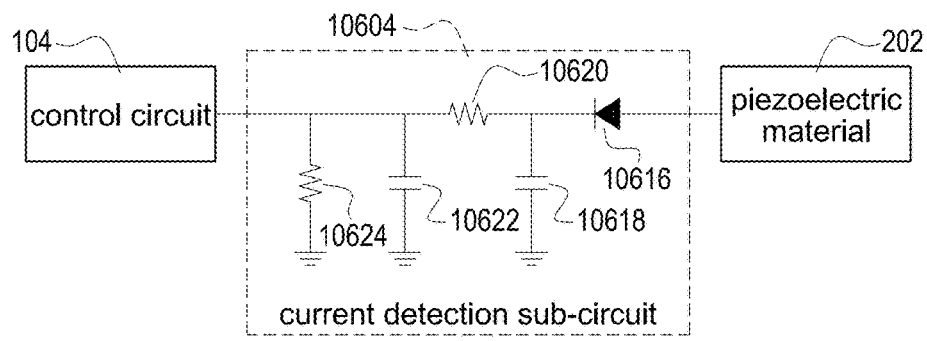
FIG. 8 shows a circuit diagram of the current detection sub-circuit of the present invention.

FIG. 8 shows a circuit diagram of the current detection sub-circuit of the present invention. The current detection sub-circuit 10604 comprises a fourth diode 10616, a fifth capacitor 10618, a sixth resistor 10620, a sixth capacitor 10622 and a seventh resistor 10624.

The fourth diode 10616 is electrically connected to the piezoelectric material 202. The fifth capacitor 10618 is electrically connected to the fourth diode 10616. The sixth resistor 10620 is electrically connected to the fourth diode 10616, the fifth capacitor 10618 and the control circuit 104. The sixth capacitor 10622 is electrically connected to the sixth resistor 10620 and the control circuit 104. The seventh resistor 10624 is electrically connected to the sixth resistor 10620, the control circuit 104 and the sixth capacitor 10622.

Figure 9:
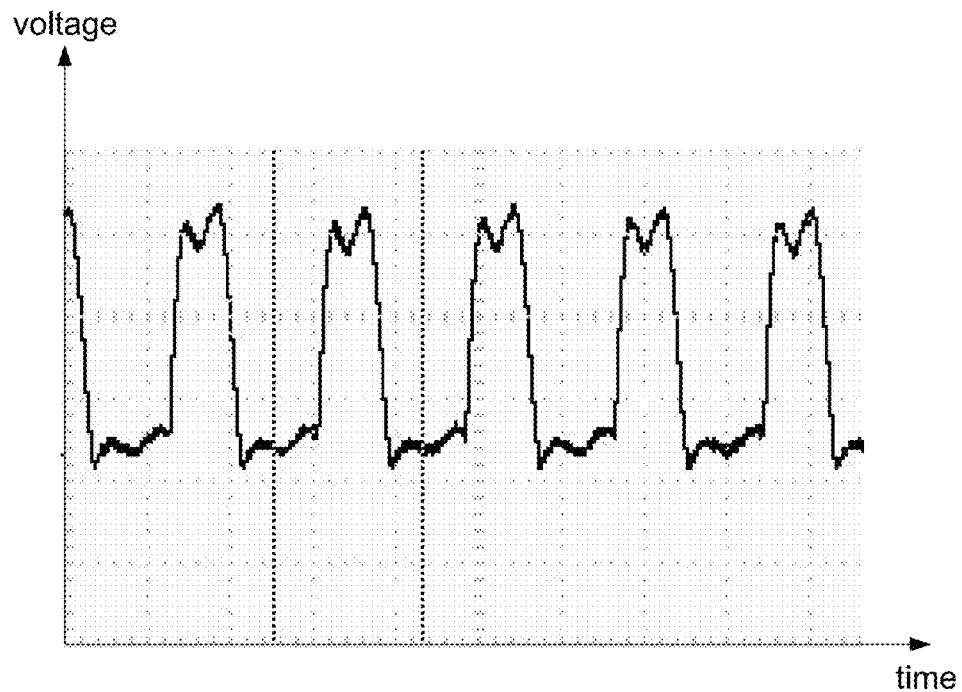
FIG. 9 shows a voltage waveform diagram of the nebulizer which is not operated with the working frequency of the present invention.
Figure 10:
FIG. 10 shows a voltage waveform diagram of the nebulizer which is operated with the working frequency of the present invention.

FIG. 9 shows a voltage waveform diagram of the nebulizer which is not operated with the working frequency of the present invention. FIG. 10 shows a voltage waveform diagram of the nebulizer which is operated with the working frequency of the present invention. As shown in FIG. 9, the voltage waveform has depressions, so that the nebulizing effect is not good. As shown in FIG. 10, the voltage waveform does not have depressions, so that the nebulizing effect is good.

The advantages of the present invention comprise:

1. The working frequency of the nebulizer is traced and adjusted automatically, so that the nebulizing effect of the nebulizer is optimized.

2. Only the old nebulizing module is replaced by a new nebulizing module when the piezoelectric material of the nebulizer is damaged. The whole nebulizer does not need to be abandoned. As for the new nebulizing module, the working frequency of the nebulizer is adjusted automatically, so that the nebulizing effect of the nebulizer is optimized.

3. When liquid in the liquid chamber is exhausted, the nebulizer will shut down automatically to save energy and protect the nebulizer.

Although the present invention has been described with reference to the preferred embodiment thereof, it will be understood that the invention is not limited to the details thereof. Various substitutions and modifications have been suggested in the foregoing description, and others will occur to those of ordinary skill in the art. Therefore, all such substitutions and modifications are intended to be embraced within the scope of the invention as defined in the appended claims.

What is claimed is:

1. A nebulizing driving apparatus comprising:

a driving circuit electrically connected to a piezoelectric material of a nebulizing module;

a control circuit electrically connected to the driving circuit; and a feedback circuit electrically connected to the driving circuit, the control circuit and the piezoelectric material, wherein the control circuit is configured to control the driving circuit to drive the piezoelectric material with a driving frequency, the feedback circuit is configured to detect an electrical data fed back from the piezoelectric material and to send the electrical data to the control circuit, the control circuit is configured to control the driving circuit to drive the piezoelectric material with a working frequency based on the electrical data, and the control circuit is configured to select a current driving frequency as the working frequency if (1) the electrical data corresponding to the current driving frequency is greater than the electrical data corresponding to a previous driving frequency and the electrical data corresponding to the current driving frequency is greater than the electrical data corresponding to a next driving frequency, (2) the next driving frequency is greater than the current driving frequency, and (3) the current driving frequency is greater than the previous driving frequency.

2. The nebulizing driving apparatus in claim 1, wherein the nebulizing module comprises a liquid chamber connected to the piezoelectric material, and the driving circuit is configured to cause a liquid in the liquid chamber to be nebulized by driving the piezoelectric material.

3. The nebulizing driving apparatus in claim 1, wherein the driving frequency is one of a plurality of different driving frequencies, and the feedback circuit is configured to:

detect a plurality of the electrical data fed back from the piezoelectric material corresponding to the driving frequencies of the plurality of different driving frequencies; and send the plurality of electrical data to the control circuit to determine the working frequency.

4. The nebulizing driving apparatus in claim 3, wherein the control circuit is configured to select the driving frequency by which the piezoelectric element is driven as the working frequency based on a determination that the electrical data of the plurality of electrical data corresponding to the selected driving frequency is a maximum of the plurality of electrical data as the working frequency.

5. The nebulizing driving apparatus in claim 1, wherein the electrical data corresponding to the working frequency is indicative of a current value, and the electrical data is a maximum of a plurality of current values detected by the feedback circuit.

6. The nebulizing driving apparatus in claim 1, wherein the electrical data corresponding to the working frequency is indicative of a voltage value, and the electrical data is a maximum of a plurality of voltage values detected by the feedback circuit.

7. The nebulizing driving apparatus in claim 1, wherein
the control circuit is configured to calculate a plurality of power values based on a plurality of current values detected by the feedback circuit and a plurality of corresponding voltage values detected by the feedback circuit, and
the control circuit is configured to select the driving frequency associated with a maximum of the power values as the working frequency.

8. The nebulizing driving apparatus in claim 1, wherein the control circuit is configured to control the driving circuit to stop driving the piezoelectric material based on a detection by the feedback circuit that the electrical data fed back from the piezoelectric material is less than or greater than a maximum of the electrical data by an offset amount over a predetermined time.

9. The nebulizing driving apparatus in claim 1, wherein the feedback circuit comprises:
a voltage detection sub-circuit electrically connected to the driving circuit, the control circuit and the piezoelectric material; and
a current detection sub-circuit electrically connected to the control circuit and the piezoelectric material.

10. A nebulizing system, comprising:
a nebulizing driving apparatus; and
a nebulizing module electrically connected to the nebulizing driving apparatus,
wherein the nebulizing module comprises:
a piezoelectric material electrically connected to the nebulizing driving apparatus,
wherein the nebulizing driving apparatus comprises:
a driving circuit electrically connected to the piezoelectric material;
a control circuit electrically connected to the driving circuit; and
a feedback circuit electrically connected to the driving circuit, the control circuit and the piezoelectric material,
wherein
the control circuit is configured to control the driving circuit to drive the piezoelectric material with a driving frequency,
the feedback circuit is configured to detect an electrical data fed back from the piezoelectric material and to send the electrical data to the control circuit,
the control circuit is configured to control the driving circuit to drive the piezoelectric material with a working frequency based on the electrical data, and
the control circuit is configured to select a current driving frequency as the working frequency when (1) the electrical data corresponding to the current driving frequency is greater than the electrical data corresponding to a previous driving frequency and the electrical data corresponding to the current driving frequency is greater than the electrical data corresponding to a next driving frequency, (2) the next driving frequency is greater than the current driving frequency, and (3) the current driving frequency is greater than the previous driving frequency.

11. The nebulizing system in claim 10, wherein the nebulizing module comprises a liquid chamber connected to the piezoelectric material, and the driving circuit is configured to cause a liquid in the liquid chamber to be nebulized by driving the piezoelectric material.

12. The nebulizing system in claim 10, wherein the driving frequency is one of a plurality of different driving frequencies, and the feedback circuit is configured to:
detect a plurality of the electrical data fed back from the piezoelectric material corresponding to the driving frequencies of the plurality of different driving frequencies; and
send the plurality of electrical data to the control circuit to determine the working frequency.

13. The nebulizing system in claim 12, wherein the control circuit is configured to select the driving frequency by which the piezoelectric element is driven as the working frequency based on a determination that the electrical data of the plurality of electrical data corresponding to the selected driving frequency is a maximum of the plurality of electrical data as the working frequency.

14. The nebulizing driving apparatus in claim 10, wherein the electrical data corresponding to the working frequency is indicative of a current value, and the electrical data is a maximum of a plurality of current values detected by the feedback circuit.

15. The nebulizing driving apparatus in claim 10, wherein the electrical data corresponding to the working frequency is indicative of a voltage value, and the electrical data is a maximum of a plurality of voltage values detected by the feedback circuit.

16. The nebulizing driving apparatus in claim 10, wherein
the control circuit is configured to calculate a plurality of power values based on a plurality of current values detected by the feedback circuit and a plurality of corresponding voltage values detected by the feedback circuit, and
the control circuit is configured to select the driving frequency associated with a maximum of the power values as the working frequency.

17. The nebulizing driving apparatus in claim 10, wherein the control circuit is configured to control the driving circuit to stop driving the piezoelectric material based on a detection by the feedback circuit that the electrical data fed back from the piezoelectric material is less than or greater than a maximum of the electrical data by an offset amount over a predetermined time.

18. The nebulizing driving apparatus in claim 10, wherein the feedback circuit comprises:
a voltage detection sub-circuit electrically connected to the driving circuit, the control circuit and the piezoelectric material; and
a current detection sub-circuit electrically connected to the control circuit and the piezoelectric material.

* * * * *